United States Patent [19]
Knecht et al.

[11] Patent Number: 5,281,935
[45] Date of Patent: Jan. 25, 1994

[54] SURFACE MOUNTABLE PIEZOELECTRIC DEVICE USING A METALLIC SUPPORT STRUCTURE WITH IN SITU FINISH PLATE MASK

[75] Inventors: Thomas A. Knecht, Crystal Lake; Jean-Robert Achille, Bloomingdale; Marlin Luff, Wheaton, all of Ill.

[73] Assignee: Motorola, Inc., Schaumburg, Ill.

[21] Appl. No.: 905,593

[22] Filed: Jun. 26, 1992

Related U.S. Application Data

[63] Continuation-in-part of Ser. No. 689,397, Apr. 22, 1991, abandoned.

[51] Int. Cl.$^5$ .............................................. H03H 9/48
[52] U.S. Cl. ..................... 333/187; 333/188; 333/191; 333/192; 310/348
[58] Field of Search .......................... 333/187–192; 310/348, 354–356

[56] References Cited

U.S. PATENT DOCUMENTS
3,573,672  4/1971  Fair et al. ............................. 333/191

FOREIGN PATENT DOCUMENTS
| 92010 | 5/1986 | Japan | 333/188 |
| 152208 | 7/1987 | Japan | 310/348 |
| 241414 | 10/1987 | Japan | 333/187 |
| 187508 | 8/1991 | Japan | 333/188 |
| 35311 | 2/1992 | Japan | 333/188 |

Primary Examiner—Benny Lee
Attorney, Agent, or Firm—Joseph P. Krause

[57] ABSTRACT

A surface mountable piezoelectric device that includes an in situ finish plate mask is mounted on a substrate (20) that includes feedthrough holes (26, 28, and 30) to conduct signals from a piezoelectric element (40) that may include multiple resonator stages (48, 46, 50, and 56). A metallic support structure that includes windows or holes therethrough (72, 74 and 76) permits tuning of the piezoelectric device by mass loading during manufacturing, compliantly supports the piezoelectric element (40), provides RF shielding for the resonators, and is an in situ finish plate mask.

14 Claims, 4 Drawing Sheets

SURFACE MOUNTABLE PIEZOELECTRIC DEVICE USING A METALLIC SUPPORT STRUCTURE WITH IN SITU FINISH PLATE MASK

This is a continuation-in-part of application Ser. No. 07/689,397, filed Apr. 22, 1991 now abandoned.

FIELD OF THE INVENTION

This invention generally relates to piezoelectric devices. In particular this invention relates to a holder or, structure, for a piezoelectric device that enhances a piezoelectric element's manipulation during the manufacturing process, it's tuning, use, and operation.

BACKGROUND OF THE INVENTION

Piezoelectric devices generally include at least quartz resonators and quartz filters. Both of these types of devices are typically constructed using a thin plate of piezoelectric quartz material. This thin plate is usually cut from a larger piece of quartz with a certain angular orientation of the cut with respect to the crystalline lattice structure of the quartz to produce a plate that will vibrate in some predetermined desired mode. (So-called GT-cut crystals for instance vibrate in a so-called face-shear mode, which is a vibration mode that has a non-vibrating nodal area at the center of the plate.)

The thin plate of piezoelectric quartz has opposing surfaces to which are bonded electrically conductive materials and upon which an electric signal is impressed that causes the quartz plate to vibrate. At one or more particular frequencies, the input impedance of a quartz resonator, or filter, (as seen looking into the electrodes) is minimized and this frequency (or frequencies) is the resonant frequency of the resonator or filter.

In many respects, a quartz filter or resonator are mechanical devices in that electrical signals coupled to a pair of input electrodes coupled to the quartz plate induce mechanical vibrations in the plate. In a quartz filter, the vibrations induced in the crystal from an input signal are transmitted through the crystalline structure of the quartz to an output resonator stage, which is also comprised of output electrodes bonded to the surface of the piezoelectric plate, whereat the mechanical vibrations induce electrical signals on the output electrodes. Most crystal filters permit only a relatively narrow band of frequency signals on the input electrodes to pass through the crystal to the output electrodes and as such, a quartz filter acts like virtually any other electrical filter constructed from passive circuit elements such as resistors, inductors, and capacitors except that a quartz filter is constructed from a thin plate of dielectric material.

A quartz resonator, like a quartz filter, is also a mechanical device in that electrical signals coupled to a pair of input electrodes coupled to the quartz plate induce mechanical vibrations in the plate. As in a quartz filter, physical characteristics of the quartz plate, such as its thickness, length, width, temperature, cut orientation, etc., will effect a relatively low input impedance to a driving signal source at the resonant frequency of the plate. (The resonant frequency of the plate is a frequency at which the plate most naturally vibrates. A quartz plate might have several different resonant frequencies including overtones, harmonics.) Because the crystal presents a high impedance away from a resonant frequency, a quartz resonator can be used to control an oscillator circuit.

In fabricating a piezoelectric resonator or a piezoelectric filter, the frequencies of its operation can be affected by many factors including the thickness of the quartz, the orientation of the crystal lattice structure of the quartz with respect to the directions in which it is cut and the dimensions of the electrodes bonded to the surfaces of the quartz material. The resonant frequency can be changed by changing the mass loading on the piezoelectric quartz, which can be accomplished by either decreasing or increasing the thickness of the electrodes. In a quartz filter, characteristics such as the bandwidth, Q, and so forth, can also be adjusted by changing the mass loading of the electrodes on the surfaces of the piezoelectric quartz.

Prior art methods of tuning a piezoelectric device, such as a resonator or filter, generally use a vacuum deposition process in which atoms of electrode material are added to the electrodes while the electrical characteristics of the device are monitored. Material is typically added to the electrodes using a vacuum deposition chamber and a so called finish plate mask, which is simply a template or mask having openings or windows aligned with and placed over the electroded areas of the quartz. The mask is usually physically separated from the quartz by some distance away from the surface of the quartz. Atoms that pass through the windows in the mask during the tuning process attach themselves to the surfaces of the electrodes on the quartz to increase the thickness of the electrodes and increase the mass loading of the electrodes on the quartz, decreasing the resonant frequency of the plate/electrode combination.

Alternate methods of tuning a piezoelectric device might remove material from electroded areas, reducing mass loading and increasing resonant frequencies. For a variety of reasons, adding material to electrodes is preferred over removing material, one reason being the difficulty in uniformly removing material from an existing, planar electrode compared with the relative ease of uniformly adding material using vapor deposition techniques.

A problem with prior art tuning methods that add material using a finish plate mask is that the physical registration, or alignment, between the finish plate mask and the electrodes on the surfaces of the piezoelectric plate must be carefully controlled. Any misalignment between the windows or openings in the finish plate mask with respect to the electrodes, can cause a widening or a shifting of the area of the electrode effecting other electrical characteristics of the device.

Even after a piezoelectric device is tuned using the prior art method of using a finish plate mask, a second problem with the prior art piezoelectric devices is the subsequent fixturing or attachment of the tuned piezoelectric device to a substrate by which it might be mounted to a circuit board. Much effort has been spent attempting to miniaturize electrical components using so called surface mount techniques. Mounting a tuned piezoelectric device to a substrate or carrier that is suitable for surface mount manufacturing presents a significant problem because of the physical dimensions of quartz devices, particularly those with resonant frequencies in the megahertz frequencies.

A third problem with prior art piezoelectric devices is that the quartz material comprising a piezoelectric device must be compliantly mounted to its substrate so that mechanical stresses on the quartz, from either thermal effects or mechanical shock, are minimized. Rigidly attaching a piezoelectric device to any type of substrate invites mechanical stresses in the piezoelectric as its temperature changes. Mechanical vibrations, including mechanical shock can also be transmitted into the quartz plate if it is not properly mounted. Mechanical stresses can affect the resonant frequency or the frequency of operation significantly and many techniques for compliantly mounting a piezoelectric have been suggested.

Yet another problem with prior art piezoelectric devices is electromagnetic shielding some of these devices might require. Strong electromagnetic fields can also adversely affect the operation of a piezoelectric device. Since these devices may require shielding from electromagnetic fields, providing such shielding frequently requires their enclosure into a volume enclosed by metallic or conductive material.

A device that accommodates all of these prior art difficulties, including the compliant mounting of the quartz, precise alignment of a finish plate mask during manufacturing but yet one that preferably does not have to be removed after adjustment, surface mounting of the finished device on to a substrate, and the RF shielding, while providing a signal path to the device, would be an improvement over the prior art.

DESCRIPTION OF A PREFERRED EMBODIMENT

In the preferred embodiment of the invention, a thin, metallic foil is shaped to form a substantially planar cover or roof section that is supported by a plurality of mounting legs located at predetermined positions around the perimeter of the cover section. The cover or roof section has sufficient area to virtually cover the piezoelectric device but has predetermined geometric shapes cut through it that provide openings or windows in the foil used during tuning.

Mounting legs are formed by bending the metallic foil at predetermined locations so that the cover section and the legs are initially comprised of one continuous piece of foil. After bending, the piezoelectric element can be attached to the foil, using for example conductive adhesive dollops and thereafter the mounting legs can be formed by removing predetermined portions of the foil leaving the support legs to support, or suspend, the piezoelectric as set forth below.

The piezoelectric device is attached to the foil at predetermined locations using any appropriate mechanism, adhesives or other bent sections of foil for example, so as to align the windows in the foil with electrodes on the surface of the piezoelectric device. Signal paths to electrodes on the piezoelectric are accomplished by conductively attaching the bent sections of the foil, which bent sections comprise the mounting legs, to electrodes on the piezoelectric device and then physically severing material comprising the foil at predetermined locations to electrically isolate foil sections to provide electrically isolated conductive signal paths between the electrodes on the piezoelectric and external signal sources or destinations.

The attachment means should attach the piezoelectric resonator at a precise distance from the foil. Compliant mounting is provided in part by the flexibility of the foil. Compliance might also be provided by an appropriate material used for the adhesive mounting dollops.

Figure 1:
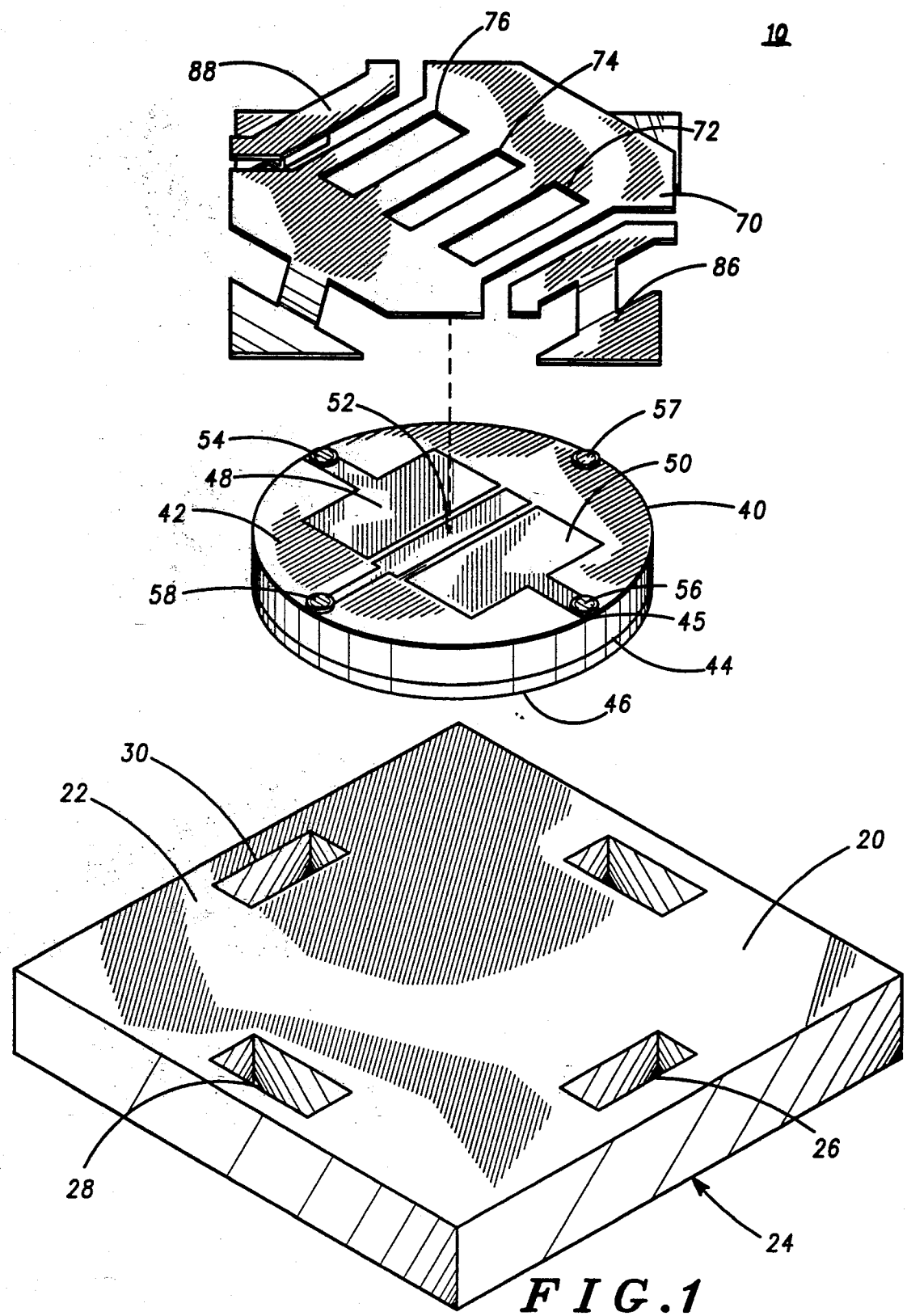
FIG. 1 shows an exploded perspective view of a surface mountable two pole quartz filter including an in-situ finished plate mask.

FIG. 1 shows an exploded perspective view of the elements of a surface mountable piezoelectric device (10) that is surface mountable, that includes a finish plate mask and that also provides compliant support for the piezoelectric element, radio frequency shielding, and input/output signal paths for electrodes on the piezoelectric plate (40).

(Compliantly mounting or supporting a piezoelectric element is considered herein to be any mounting means by which mechanical stresses on the quartz, from either thermal effects or mechanical shock, are minimized. Rigidly attaching a piezoelectric device to any type of substrate invites mechanical stresses in the piezoelectric as its temperature changes. Mechanical vibrations, including mechanical shock can also be transmitted into the quartz plate if it is not properly mounted. Mechanical stresses can affect the resonant frequency or the frequency of operation significantly and many techniques for compliantly mounting a piezoelectric have been suggested. Compliantly supporting or suspending a piezoelectric device at least reduces, and preferably avoids these problems.)

The piezoelectric device (10) is comprised of a substrate (20), which may be a ceramic, glass, Teflon or other dielectric material, but that of necessity has an upper surface (22) and a lower surface (24), the substrate being designed to be surface mounted to a circuit board, typically using a reflow solder process well known in the art. The substrate layer (20) shown in FIG. 1, has at least three feedthrough holes or vias (26, 28, and 30) through which conductive material carries electrical signals from the upper surface (22) to the lower surface (24) of the substrate layer (20). Alternate embodiments of the substrate might contemplate using conductive wrap-arounds (or castellations filled with conductive material for example, which are not shown but which are themselves known in the art) that extend from signal connection points on the lower side (24) of the substrate (20) around the perimeter faces of the substrate (20) to the upper surface (22). Conductive vias are considered herein to include conductive wrap-arounds, filled castellations on the sides of the substrate (20), wires, as well as any other means by which signals on the electrodes on the piezoelectric device (40) are coupled to the exterior or lower surface (24) of the substrate (20).

The piezoelectric device (10) also includes a piezoelectric plate (40), as shown in FIG. 1. The piezoelectric plate (40) has two substantially planar but opposing surfaces (42 and 44) and, in the embodiment shown in FIG. 1 which has a circular cross-sectional shape, is bounded by an outer edge (45) that circumscribes the piezoelectric plate (40).

The piezoelectric plate (40) shown in FIG. 1 accommodates two resonator stages, (an input stage and an output stage respectively defined by an electrode layer 46 covering the lower surface 44 of the plate 10 and the input and output electrodes 48 and 50 respectively) and as such, the piezoelectric plate (40) functions as a piezoelectric filter in that not all electrical signals on the filter's input stage are available or appear at the filter's output stage. The lower electrode layer (46) acts as a reference potential electrode for each of the two resonator stages. Alternate embodiments of the invention would include piezoelectric plates with but one resonator stage, (the lower electrode layer 46 and only one of the upper electrodes 48 or 50, for example) as in a piezoelectric resonator. Still other embodiments of the invention contemplate piezoelectric plates with more than two resonator stages, as in a multi-pole filter.

In the embodiment shown in FIG. 1, the first upper electrode (48) and the lower, ground layer (46) on the lower layer can be considered to comprise an input or first resonator stage. The ground layer (46) in combination with the second upper electrode (50) can be considered to comprise an output or second resonator stage.

Alternate embodiments of the invention would contemplate a ground or lower electrode (46) that does not completely cover the lower side (44) of the piezoelectric plate (40). In such an embodiment, a second resonator stage might be comprised of a signal electrode on the lower side (44) of the plate (40) with the ground electrode for such a second resonator on the upper side (42) of the plate (40). (It should be pointed out that the designation of one resonator stage as an input stage and an another resonator stage as an output is arbitrary. Either resonator would function as either an input or an output resonator.)

As explained above, electrical input signals coupled to the input resonator stage induce mechanical vibrations in the piezoelectric plate (40) that propagate through the plate and induce electrical signals on the output resonator stage electrode (50). As such, electrical signals are passed between the resonator stages through the quartz material. The area of the electrodes on the plate (40) as well as the thickness of the electrodes determine the Q of the filter as well as its bandwidth, center frequency and other characteristics. In some applications, a bandwidth tuning bar or strip (52) can be added to the upper surface (42) of the plate (40) in a region generally located between the input electrode (48) and the output electrode (50) shown in FIG. 1 to adjust the coupling between the resonator stages which changes the bandwidth and possibly the resonant frequency of the device.

The compliant physical support of the piezoelectric plate (40), RF signal shielding, and input/output signal paths as well as an in-situ finish plate mask are provided to the piezoelectric device (10) shown in FIG. 1 by means of the metallic support structure (70). In the preferred embodiment, cut-away portions (86 and 88) of the metallic support structure (70) provide electrically isolated signal paths to electrodes (48 and 50) on the plate (40) by means of conductive dollops of adhesive (54, 56) that provide electrical contact between the electrodes (48 and 50) on the plate (40) and the cut-away signal portions (86 and 88). Mechanical support to the plate (40) and connection of the ground layer (46) is provided by other dollops (57 and 58) that also electrically couple the support structure (70) to the ground layer (46) and mechanically couple it to the support structure (70). Reference numerals 72, 74, and 76, in FIG. 1, identify windows in the support structure (70) through which atoms of material, targeted for electrodes on the plate (40), can pass.

Figure 2:
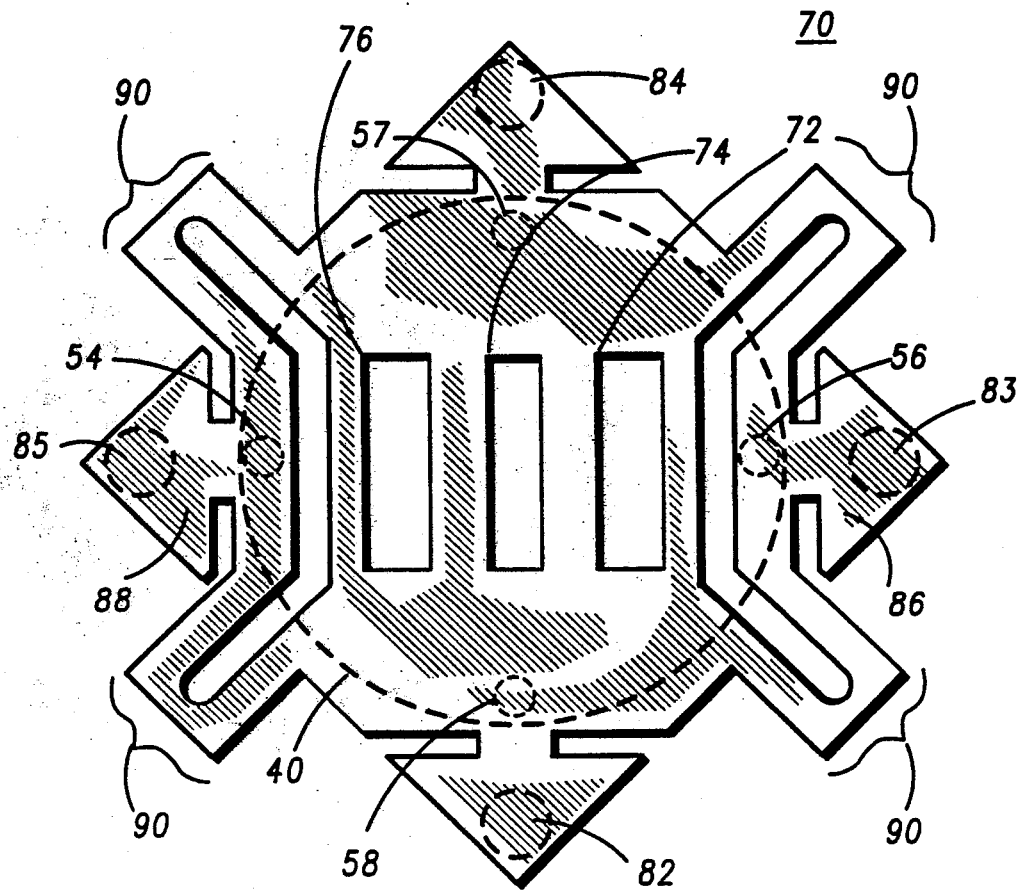
FIG. 2 shows a top view of the metallic support structure that provides compliant mounting, radio frequency shielding, a finish plate mask, and a supporting structure for the filter.

FIG. 2 shows a top view of the metallic support structure (70) shown in FIG. 1 prior to its attachment to the piezoelectric element (40). The three windows (72, 74, and 76) which are rectangularly shaped holes extending through the support structure (70), permit metallic atoms to find electrodes on the piezoelectric plate (40) during the tuning process of the piezoelectric device. The windows (72, 74, and 76) are preferably positioned directly over electroded areas on the piezoelectric plate (40) to restrict the attachment area of metallic atoms flowing through the windows in the tuning process to only the appropriate electrodes. (48 and 50 as well as any bandwidth bar 52. See FIG. 1)

The metallic support structure (70) as shown in FIG. 2 can be stamped from any suitable metallic foil such as nickel/silver or copper using any mask or die to produce its desired geometric shape and the locations of the windows (72, 74, and 76) on the foil. In some embodiments of the invention where a metallic foil is not needed or otherwise appropriate, the support structure (70) might be comprised of other materials, even nonmetals. These of course might themselves then be coated with metal to produce largely the same characteristics as a pure metal foil.

Referring to both FIGS. 1 and 2, the conductive dollops (54 and 56) shown in FIG. 1 align with input-/output foil contact pads (86 and 88) shown in FIG. 2. The support structure (70) shown in FIG. 2 provides no way of electrically isolating electrical signals because it is one continuous conductive foil. The conductive dollops (54 and 56) shown in FIG. 1 that align with the under sides of the input/output pads (86 and 88) are electrically isolated from the rest of the conductive foil by removing the metal tabs in the regions shown in FIG. 2 denoted by reference numeral 90. The regions denoted by reference numeral 90 can be removed using a suitable laser, for example, but may be mechanically etched or cut as desired.

When the conductive tabs in the regions identified by reference numeral 90 are removed, the contact areas denoted by reference numerals 86 and 88 are electrically isolated from the rest of the metallic support structure (70), which is typically connected to the electrical reference potential for the device (10) or ground through conductive supports, such as the dollops of conductive adhesive (57 and 58) described above and shown in FIG. 1. In most applications, the bandwidth bar (52) shown in FIG. 1 is also coupled to ground by means of a conductive support or dollop (58).

Figure 3:
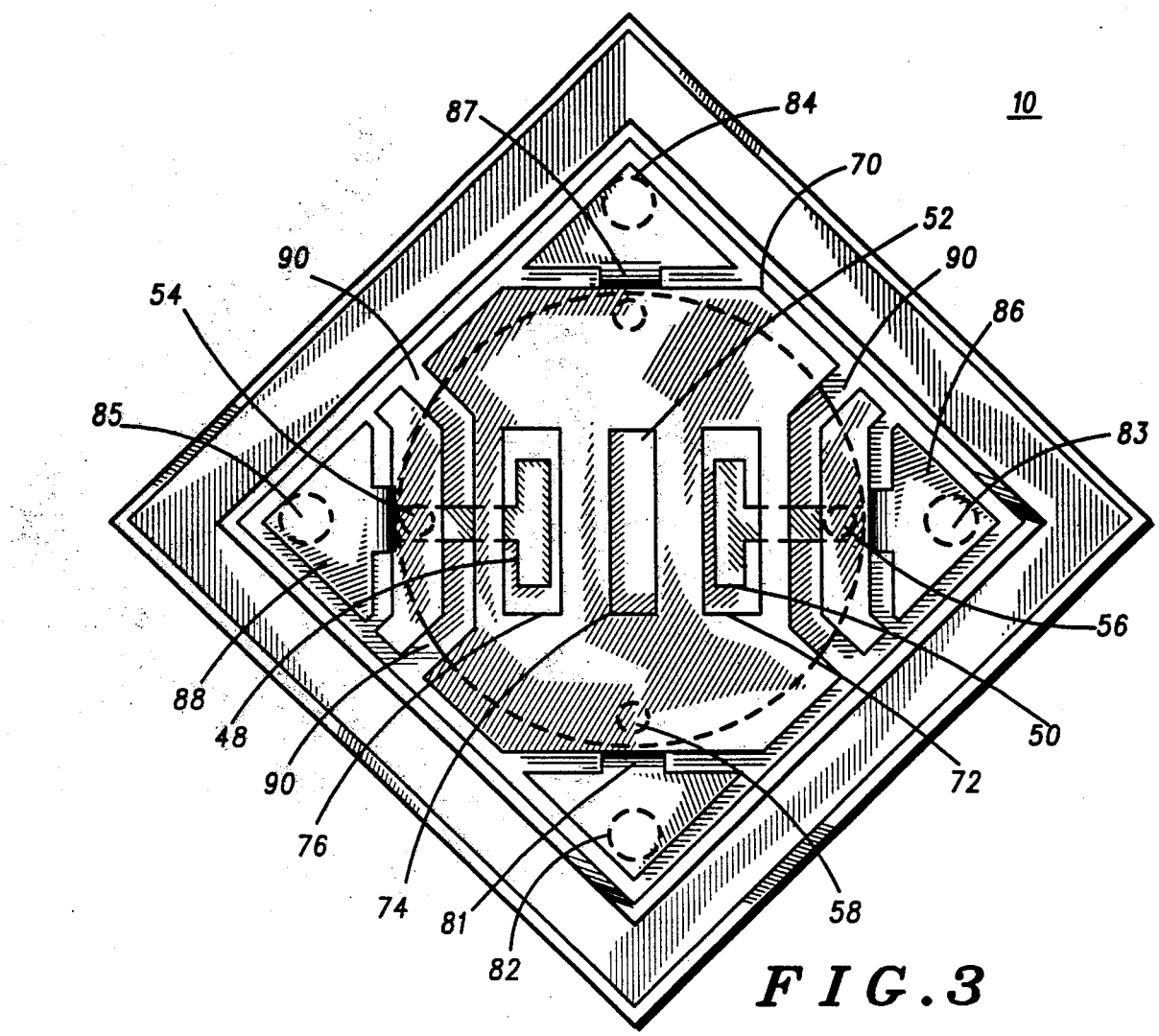
FIG. 3 shows a top view of an assembled surface mountable piezoelectric device on a ceramic substrate and covered by a metallic support structure shown in FIG. 2.

Referring to FIG. 3 there is shown a top view of an assembled piezoelectric device (10) suitable for surface mounting using in a metallic support structure (70) as part of a package that provides compliant support for the piezoelectric package, RF shielding, input/output traces, and a finish plate mask.

Note that in FIG. 2 the foil material in the areas identified by reference numeral 90 are removed. In both FIG. 2 and 3, input/output contact regions are provided for by sections of the foil identified by reference numerals 86 and 88, which as described above using the dollops of conductive adhesive (54 and 56), are electrically connected to the electrodes (48 and 50, as shown in FIG. 1) on the upper surface (42) of the resonator plate (40) shown in FIG. 1. Removing the material identified by reference numeral 90 that is shown in FIG. 2 electrically isolates the input/output paths, (also considered to be pads or terminals and identified by reference numerals 86 and 88 in FIGS. 2 and 3) from the central portion of the metallic support structure (70). The central portion of the metallic support structure (70), is electrically coupled to ground at least by means of the conductive dollop (58) for the bandwidth bar (52) being in contact with the metallic support structure (70) near one of the support legs (identified by reference numeral 81). (A second support leg 87 is seen on the side of the support structure (70) opposite leg 81.) Immediately beneath the support leg (81), a feedthrough hole (28, shown in FIG. 1) in the substrate (20) (Shown in FIG. 1.) might be used to couple the metallic support structure, minus the input/output pads (86 and 88) to ground by a connection to a ground, or reference potential on a circuit board.

As described above, input/output signal paths are established in the piezoelectric device (10) shown in FIG. 3 by means of the signal pads (86 and 88) being electrically coupled to the electrodes (48 and 50). An input pad might be considered pad 88, which is shown coupled to electrode 48. An output pad might be considered pad 86, and is coupled to electrode 50. The input pad (88) aligns with and is connected to the input feedthrough hole (30). The output pad (86) aligns with and is coupled to the output feed-through (26). Electrical connection can thereby be established between the lower surface (24) of the substrate (20) and the electrodes (48 and 50) on the piezoelectric plate (40) by means of the feedthrough holes (26 and 30). Similarly, connection to ground potential can be had through feed-through 28.

Figure 4:
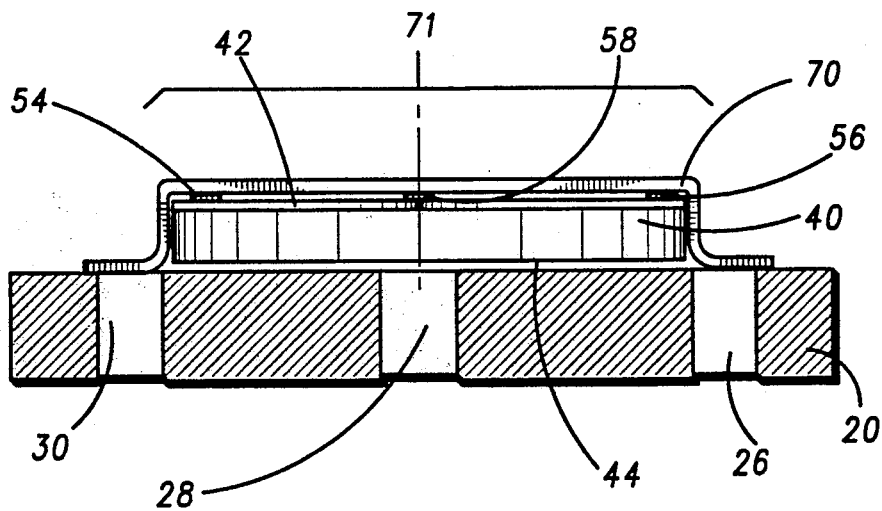
FIG. 4 shows a side view of the apparatus shown in FIG. 1 and FIG. 3.

FIG. 4 shows a side view of the structure shown in FIGS. 1 and 3. The substrate (20) that with the feed-through holes (26, 28, and 30, as shown in FIG. 1) is surface mountable, and is physically coupled to the metal support structure (70) that supports the piezoelectric element (40) by means of the conductive dollops (54, 56, and 58) so as to suspend the piezoelectric element (40) above the substrate (20). As shown in FIGS. 2 and 3, the substrate (20) can be coupled to the support structure (70) using any appropriate adhesive, in the locations indicated by the broken lines labelled with reference numerals 82, 83, 84, and 85.

It can be seen in FIG. 4 that the metallic support structure (70) has a substantially planar center or cover section (71) that is generally parallel to the surfaces (42 and 44) of the piezoelectric element (40). (Alternate embodiments of the invention would include using non-planar cover sections, such as parabolic or elliptic-shaped cover sections.) The cover section (71) is also in relatively close proximity to the upper surface (42) of the piezoelectric element (40), a distance maintained by the size and composition of the dollops (54, 56, and 58). Instead of adhesive dollops, other embodiments might use foil tabs bent from the support structure but these might require their own adjustment during manufacturing. The close physical proximity of the piezoelectric element (40) to the planar section of the support structure (70) permits very precise registration of the windows or through holes to permit very precise mass loading of the electrodes (48, 50, and 52).

The structure shown in the figures is intended to be assembled prior to final tuning to reduce the number of steps required to use the piezoelectric device. The metallic support structure (70) including the attached piezoelectric element (40) can be finally tuned or adjusted and enclosed in an appropriate carrier without removing the finish plate mask from the piezoelectric element (40).

The embodiment shown in the FIGS. 1 and 3 depicts two windows or openings (72 and 76) that align with the electrodes (50 and 48) respectively. Alternate embodiments of the invention would, of course, include adding the third window (74) shown in the figures (e.g. see FIGS. 1, 2, and 3) to permit mass loading of a bandwidth bar (52) shown in FIG. 1. Still other embodiments might contemplate deletion of the bandwidth bar window (74), in which case mass loading of the bandwidth bar itself (52) would not be possible.

Still other embodiments of a resonator might contemplate a piezoelectric element (40) devoid of any bandwidth bar per se (52) during which a bandwidth bar is added by means of a window (74) in the metallic support structure that permits the deposition of atoms on to the upper surface (42) of the piezoelectric plate (40). It should be understood that the holes are pre-positioned to align with the electrodes on the surface of the piezoelectric element (40). While two resonator input stages are shown in the structure shown in FIG. 1, alternate embodiments of the invention would, of course, include a quartz filter comprised of multiple resonator stages but which are not shown in FIG. 1 for the purposes of clarity in the figure.

Figure 5:
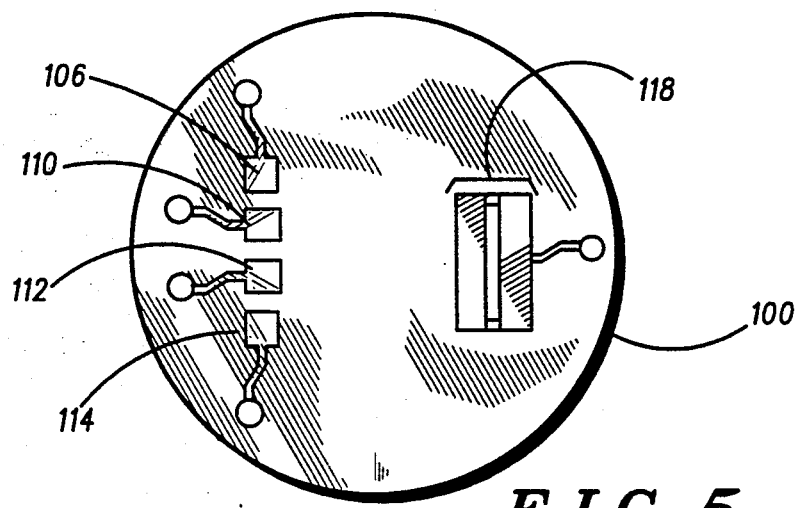
FIG. 5 shows a plan view of the arrangement of a multipole filter plus a resonator on a piece of quartz.

Still other embodiments might include the structure shown in FIG. 1 with but one resonator stage in which case such a device would be functionally equivalent to a piezoelectric resonator. To such a piezoelectric resonator, still other embodiments might add multiple resonator stages to form a monolithic quartz multipole filter, plus resonator. Such a structure is shown in FIG. 5. The mass loading during manufacturing, the RF shielding and compliant mounting would still hold true for any such device as a piezoelectric resonator or a monolithic quartz multipole filter plus resonator.

FIG. 5 shows a plan view of the locations of multiple electrodes on a piece of quartz that would comprise the electrodes for both a multipole filter and a resonator. A piece of quartz (100) has deposited on one of its surfaces (the surface shown in FIG. 5) a plurality of electrode areas that are interconnected by means of conductive traces on the surfaces of the quartz (100) to form a plurality of resonator stages that together form a multipole filter and at least one separate resonator stage. Electrodes 106, 110, 112, 114, together with their corresponding electrodes on the opposite side of the quartz (100) would form resonator stages of the multipole filter. Electrode 118 and a corresponding electrode on the lower surface of the quartz (100) would form a single resonator.

In FIG. 5, electrode areas 106, 110, 112, and 114 are electrodes on the surface of the quartz (100) that through appropriate interconnections (both on the upper and lower surfaces of the quartz slab 100) could be interconnected to form a multipole filter. Both the filter (comprised in part of electrodes 106, 110, 112, and 114) and the resonator (comprised in part of electrode 118) could be mounted and tuned and shielded using an appropriately shaped finish plate mask as described above and as shown in FIG. 1. Electrical connections between the conductive vias in the substrate (20) and the electrodes on the surfaces of the quartz would, as described above, be accomplished by using conductive adhesive dollops appropriately located between the support structure (70) and the piezoelectric element. The locations of mounting tabs or mounting adhesive, as well as the locations of the windows in the mask would of course require placement to accommodate the electrodes.

While the preferred embodiment contemplates using a so called AT cut piezoelectric plate, other embodiments might contemplate using an SC cut, for example, as well as a GT cut. The modes of vibration of these devices are well known in the art and each of them might require a slightly different attachment point other than the location of the adhesive dollops (54, 56 and 58).

Still other embodiments might contemplate a metallic support structure (70) that more rigidly supports the piezoelectric plate (40) and that does not yet provide RF shielding. Depending upon the spacing and dimensions of the windows and other gaps in the foil and on the radio frequency range of operations, the metallic support structure may or may not be considered to be providing RF shielding for the piezoelectric device it supports. Such shielding can generally be easily enhanced by enclosing an assembled piezo device in an appropriate metallic case.

Figure 6:
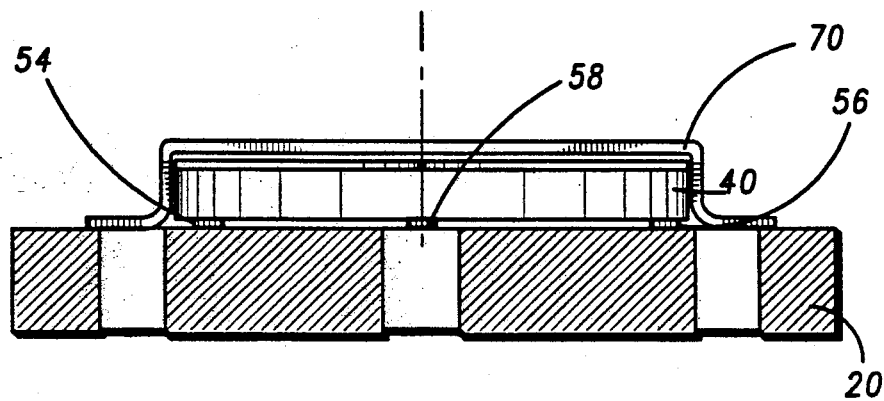
FIG. 6 shows a side view of an alternate embodiment of the invention.

A cross-sectional view of yet another embodiment of the invention is shown in FIG. 6. In FIG. 6, the piezoelectric element (40) (which might be piezoelectric quartz for example) is coupled only to the substrate (20) while the metallic support structure (70) is not really supporting the piezo element (40) but is principally acting as a finish plate mask and perhaps RF shield. In FIG. 6, electrical connection between the electrodes on the upper surface (42) of the piezo element (The surface immediately adjacent the mask/metallic support structure 70.) and the conductive mounts (54, 56, and 58) that support the piezo element, could be accomplished by means of wrap-around electrode material that extends or wraps around the side of the piezo element.

Figure 7:
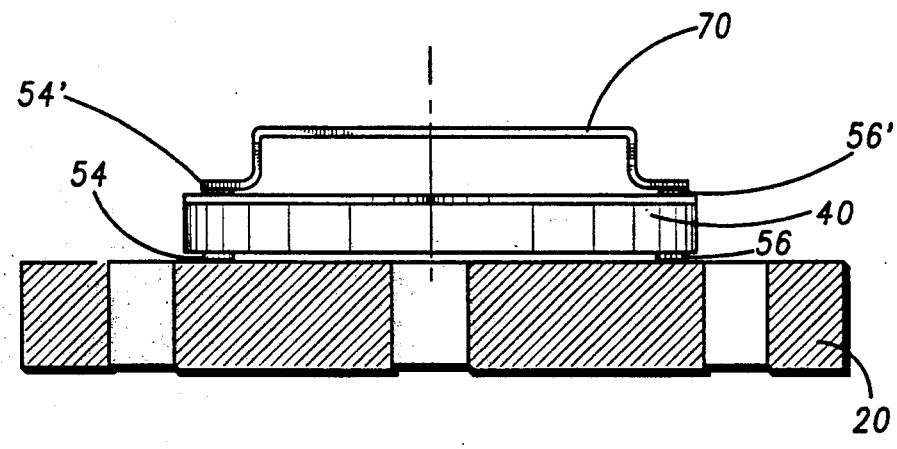
FIG. 7 shows a side view of yet another alternate embodiment of the invention.

A cross-sectional view of yet another embodiment of the invention is shown in FIG. 7. In FIG. 7, the piezoelectric element (40) is coupled only to the substrate (20) while the metallic support structure (70) is mounted onto the upper surface of the piezoelectric element. As such, the support structure is coupled only to the piezo element and is not coupled to the substrate. In FIG. 7, as in FIG. 6, electrical connection between the electrodes on the upper surface of the piezo element. (The surface immediately adjacent the mask/metallic support structure 70.) and the conductive mounts (54, 56, and 58) that support the piezo element, could be accomplished by means of wrap-around electrode material that extends or wraps around the side of the piezo element. Note that in FIG. 7, adhesive dollops 54' and 56' are shown between the support structure (70) and the piezoelectric element (40).

While the preferred embodiment of the invention as shown in FIGS. 1-4 is a metal support structure (70) that acts as a compliant support for the piezoelectric device and also acts as an RF shield, as well as an in-situ finish plate mask that can forever stay with the piezoelectric device, alternate embodiments of the invention would of course include a metal support structure (70) that does not simultaneously perform all of these functions, such as the embodiments shown in FIGS. 2, 6, and 7. Such alternate embodiments would include support structures that do not necessarily provide a compliant support or that do not provide an RF shield.

The embodiment depicted in FIG. 6 for example does not show a support structure (70) that supports the piezoelectric device (40) at all. In FIG. 6, the support structure (70) which might also not be metal, but in the embodiment shown in FIG. 6 could be some other suitable material, principally provides a finish plate mask and is coupled only to the substrate (20).

The embodiment depicted in FIG. 7 shows the support structure mounted directly to the surface of the piezoelectric device (40). In the embodiment shown in FIG. 7, the support structure would preferably be mounted to the piezoelectric device (40) at locations where such mounting would not detrimentally affect the device (40), such as at vibration nodal points. Note that in FIG. 7, adhesive mounting dollops 54' and 56' between the support structure (70) and the piezoelectric device (40) would preferably be at such nodes, as would the dollops 54 and 56 between the piezoelectric device (40) and the substrate (20).

What is claimed is:

1. A filter comprised of:
   a dielectric substrate including a plurality of conductive vias;
   a piezoelectric plate having first and second substantially planar opposing surfaces bounded by an edge;
   an input resonator stage comprised of: input and reference potential electrodes, said input and reference electrodes respectively coupled to said opposing surfaces of said piezoelectric plate;
   an output resonator stage comprised of: output and reference potential electrodes, said output and reference electrodes respectively coupled to said opposing surfaces of said piezoelectric plate; and
   a metallic support structure means for:
   i.) compliantly supporting said piezoelectric plate on said substrate;
   ii.) providing radio frequency shielding to said resonator stages;
   iii.) providing respective input and output electrical signal paths between said resonator stages and corresponding conductive vias in said substrate;
   iv.) providing a finish plate mask.

2. The filter of claim 1 where said metallic support structure means includes a plurality of prepositioned holes disposed therein, said holes substantially aligning with said input and output electrodes of said input and output resonator stages respectively.

3. The filter of claim 1 including a metallic bandwidth adjustment strip, for controlling the bandwidth of said quartz filter, said strip physically disposed between said resonator stages, and electrically isolated from said resonator stages.

4. The filter of claim 3 where said metallic support means includes at least one prepositioned hole disposed there through and which is substantially aligned with said bandwidth adjustment strip.

5. The filter of claim 1 including adhesive dollops disposed between the piezoelectric plate and the metallic support structure means.

6. A piezoelectric resonator comprised of:
   a dielectric substrate including a plurality of conductive vias;
   a piezoelectric plate having first and second substantially planar opposing surfaces bounded by an edge;

a resonator comprised of a first electrode coupled to said first substantially planar opposing surface and a second electrode coupled to said second substantially planar opposing surface;

a metallic support structure means having at least one substantially planar section substantially parallel to said planar opposing surfaces of said piezoelectric plate, said metallic support structure means electrically and mechanically coupled to said piezoelectric plate and to said substrate, said metallic support structure means and said substrate substantially surrounding said piezoelectric plate, said metallic support structure means for:

compliantly supporting said piezoelectric plate on said substrate;

providing radio frequency signal shielding to said resonator stages;

providing respective electrical signal paths between said resonator stage and corresponding conductive vias in said substrate; and providing a finish plate mask.

7. The piezoelectric resonator of claim 6 where said metallic support means includes prepositioned holes disposed through said at least one substantially planar section, said prepositioned holes substantially aligning with at least one of said first and second electrodes of said resonator stage.

8. The piezoelectric resonator of claim 6 including adhesive dollops between said piezoelectric plate and said metallic support structure for maintaining a predetermined distance between said piezoelectric plate and said at least one substantially planar section of said metallic support structure means.

9. A quartz filter comprised of:

a dielectric substrate including a plurality of conductive vias;

an AT-cut quartz crystal plate having first and second substantially planar opposing surfaces bounded by an edge;

a plurality of resonator stages, each stage comprised of: signal and reference potential electrodes, said signal and reference electrodes respectively coupled to said opposing surfaces of said quartz crystal plate;

a metallic support structure means for:

compliantly supporting said quartz crystal plate with respect to said dielectric substrate;

providing radio frequency signal shielding to at least one resonator stage of said plurality of resonator stages;

providing separate electrical signal paths between each of said resonator stages and corresponding conductive vias in said substrate; and providing a finish plate mask.

10. A quartz filter comprised of:

a dielectric substrate including conductive vias;

an AT-cut quartz plate having first and second substantially planar opposing surfaces bounded by an edge;

a first resonator stage, said first resonator stage comprised of: a first electrode coupled to said first substantially planar opposing surface and a second electrode coupled to said second substantially planar opposing surface;

a second resonator stage, said second resonator stage comprised of: a first electrode coupled to said first substantially planar opposing surface and a second electrode coupled to said second substantially planar opposing surface;

a metallic support structure means for:

supporting said piezoelectric plate on said substrate;

providing electrical signal paths between at least one electrode of said first and second electrodes of said first resonator stage and corresponding conductive vias in said substrate;

providing electrical signal paths between at least one of said first and second electrodes of said second resonator stage and corresponding conductive vias in said substrate; and providing a finish plate mask.

11. A monolithic piezoelectric multipole filter plus resonator comprised of:

a dielectric substrate including a plurality of conductive vias;

a piezoelectric plate having first and second substantially planar opposing surfaces bounded by an edge;

a filter comprised of:

at least one input resonator stage comprised of input and reference potential electrodes, said input and reference electrodes coupled to said opposing surfaces of said piezoelectric plate;

at least one output resonator stage comprised of output and reference potential electrodes, said output and reference electrodes respectively coupled to said opposing surfaces of said piezoelectric plate;

a separate resonator comprised of input and reference potential electrodes, said input and reference electrodes respectively coupled to said opposing surfaces of said piezoelectric plate; and a metallic support structure means for:

supporting said piezoelectric plate on said substrate;

providing radio frequency shielding to at least one of said filter and resonator; providing respective electrical signal paths between each of said input electrode and output electrode of said resonator stages and corresponding conductive vias in said substrate; providing signal paths between said electrodes of said separate resonator and conductive vias in said substrate; and providing a finish plate mask.

12. A piezoelectric device comprised of:

a dielectric substrate including conductive vias;

a piezoelectric plate, coupled to said dielectric substrate, having first and second substantially planar opposing surfaces bounded by an edge;

a first resonator on said piezoelectric plate comprised of: input potential and reference potential electrodes, said input and reference electrodes respectively coupled to said opposing surfaces of said piezoelectric plate, said input electrode electrically coupled to a first one of said conductive vias, said reference potential electrode electrically coupled to a second one of said conductive vias; and a metallic structure coupled only to said substrate and substantially enclosing said piezoelectric plate and including at least one hole therethrough through which atoms of electrode material can pass.

13. A piezoelectric device comprised of:

a dielectric substrate including conductive vias;

a piezoelectric plate having first and second substantially planar opposing surfaces bounded by an edge;
at least one resonator comprised of:
  input potential and reference potential electrodes, said input and reference electrodes respectively coupled to said opposing surfaces of said piezoelectric plate, said input electrode electrically coupled to a first one of said conductive vias, said reference potential electrode electrically coupled to a second one of said conductive vias; and
a metallic structure, coupled to said dielectric substrate and coupled to said piezoelectric plate so as to suspend said piezoelectric plate above said dielectric substrate and substantially enclosing said plate and having at least one substantial planar section including at least one hole therethrough which atoms of electrode material can pass, said planar section being substantially parallel to said planar opposing surfaces of said piezoelectric plate, said input and reference potential electrodes being electrically coupled to corresponding ones of said conductive vias through said metallic structure.

14. A piezoelectric device comprised of:
a dielectric substrate including a plurality of conductive vias;
an AT-cut piezoelectric plate having first and second substantially planar opposing surfaces bounded by an edge;
an input resonator stage comprised of: input and reference potential electrodes, said input and reference potential electrodes respectively coupled to said opposing surfaces of said piezoelectric plate and electrically coupled respectively to first and second ones of said conductive vias;
an output resonator stage comprised of: output and reference potential electrodes, said output and reference potential electrodes respectively coupled to said opposing surfaces of said piezoelectric plate and electrically coupled respectively to third and fourth ones of said conductive vias; and
a metallic structure, coupled to and substantially enclosing said piezoelectric plate and to said dielectric substrate, having at least one substantially planar section including at least one hole therethrough through which atoms of electrode material can pass, said planar section being substantially parallel to said planar opposing surfaces of said piezoelectric plate.

* * * * *